United States Patent [19]

Ackerson et al.

[11] Patent Number: 4,945,292
[45] Date of Patent: Jul. 31, 1990

[54] DYNAMIC VERTICAL HEIGHT CONTROL CIRCUIT

[75] Inventors: Bruce D. Ackerson, Holladay; Stephen J. Paker, Bountiful; Clayton C. Wahlquist, West Valley City, all of Utah

[73] Assignee: Unisys Corp., Blue Bell, Pa.

[21] Appl. No.: 229,539

[22] Filed: Aug. 8, 1988

[51] Int. Cl.$^5$ .............................................. H01J 29/70
[52] U.S. Cl. ...................................... 315/387; 315/370
[58] Field of Search ................................ 315/387, 370

[56] References Cited

U.S. PATENT DOCUMENTS 4,682,087  7/1987  Kikuchi .............................. 315/387
4,746,842  5/1988  Ponte et al. ......................... 315/387

*Primary Examiner*—Thomas H. Tarcza
*Assistant Examiner*—David Cain
*Attorney, Agent, or Firm*—John B. Sowell; Robert S. Bramson; Mark T. Starr

[57] ABSTRACT

The present invention provides a novel dynamic vertical height control circuit for a CRT display which is adapted to receive an input signal over a broad range of variable frequencies. The dynamic variable input frequency is applied to a free running oscillator which is coupled to a ramp generator for producing a ramp output signal. The ramp output signal is coupled back through novel feedback means comprising a comparator and means for determining the magnitude of the ramp output signal voltage for producing a feedback signal which is applied as a control signal to the ramp generator. The feedback control maintains a vertical height control signal which maintains a constant vertical display size on the CRT display.

9 Claims, 2 Drawing Sheets

DYNAMIC VERTICAL HEIGHT CONTROL CIRCUIT

BACKGROUND OF THE INVENTION

1. Field of the Invention

The present invention is related to height control circuits of the type employed in video displays which employ raster scan CRT elements. More particularly the present invention relates to an improved height control circuit for maintaining constant height output when receiving dynamically changing frequencies at the input.

2. Description of the Prior Art

Heretofore the prior art vertical height control circuits did not provide means for maintaining a constant height output while receiving a dynamically changing variable frequency input. Prior art vertical height control circuits have been provided with multiband adjustments which permit the height control circuit to be operated within a narrow band of frequencies. However, such multi-frequency vertical height control circuits require a separate voltage reference input for each of the frequency bands. Most recently monitors have been provided with means which sense the polarity of the incoming signal and/or the frequency of the incoming signal to select one of a plurality of frequency reference voltages. The problem that exists with these frequency band selecting circuits is that the vertical height output signal from the ramp generator varies in height within the band selected.

It would be extremely desirable to provide a simplified, extremely accurate and inexpensive vertical height control circuit which maintains an accurate constant vertical height while receiving a wide range of variable frequency input signals.

SUMMARY OF THE INVENTION

It is a principal object of the present invention to provide a novel vertical height control circuit for maintaining constant vertical height over a large range of input frequencies.

It is another principal object of the present invention to provide a dynamic vertical height control circuit having means for setting the desired vertical height at the output of the ramp generator.

It is another principal object of the present invention to provide a simple dynamic vertical height control circuit which may be implemented on a single semiconductor chip.

It is another object of the present invention to provide a dynamic vertical height control circuit having averaging means in the feedback loop which maintain a constant vertical height at the output of the ramp generator.

It a general object of the present invention to provide a dynamic vertical height control circuit having a single simplified height control adjustment.

According to these and other objects of the present invention there is provided a dynamic vertical height control circuit which comprises a novel feedback loop connected to the output of the ramp generator and further comprises a comparator having a vertical height control reference voltage input and a second input which determines the average amplitude at the output of the ramp generator for maintaining a constant amplitude deflection signal at the output of the height control circuit.

DESCRIPTION OF A PREFERRED EMBODIMENT

Figure 1:
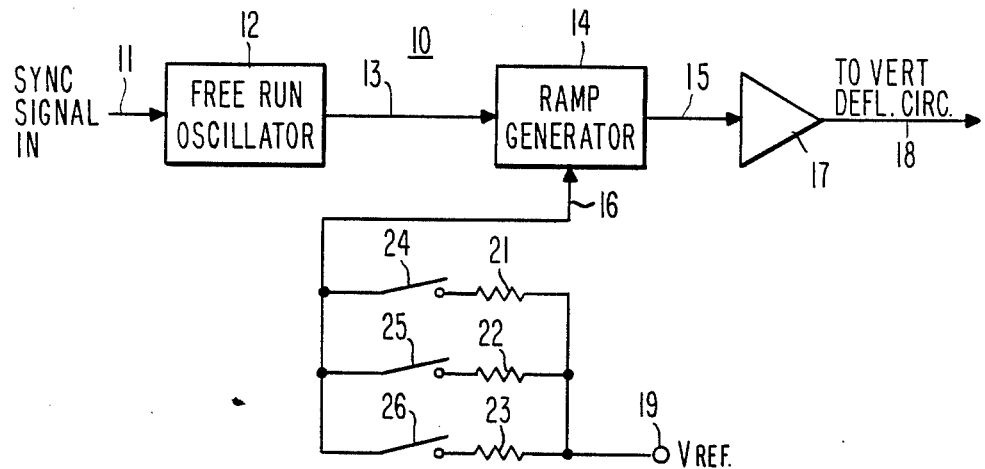
FIG. 1 is a block diagram circuit designed to illustrate prior art type step or multi-band frequency vertical height controls.

Refer now to FIG. 1 showing a prior art vertical height control circuit 10. The input signal on line 11 is the sync signal generated by the CRT control logic which controls the display rate of the CRT. It is desirable that the input signal be able to accept variable bands of frequencies such as 50 or 60 or 70 Hertz. The input signal to the free running oscillator 12 produces a reset control signal on line 13 which is applied to the ramp generator 14. The reset signal on line 13 is synchronous with the sync signal input on line 11 and causes the ramp generator 14 to produce a ramp signal output on line 15 whose frequency is determined by the input on line 13 and whose amplitude or slope is controlled by the input control signal on line 16. The output ramp signal on line 15 is conventionally amplified in an amplifier 17 to produce an output signal on line 18 which is employed to drive the vertical deflection yoke circuits.

The amplitude control signal on line 16 determines the slope of the ramp generated by the ramp generator 14, thus, the peak amplitude of the ramp voltage generated on line 15 is a function of the frequency input control signal on line 13 and the slope control signal on line 16. The amplitude control voltage on line 16 is produced by a reference voltage 19 and a plurality of band select resistors 21, 22 and 23 cooperating with band select switches 24, 25 and 26. It will be understood that the switches 24 to 26 may be automatically selected by sensing the polarity of the input signal on line 11 and/or the frequency on line 11 and automatically selecting the frequency band switch 24 to 26 for the desired sensed frequency. In the prior art the number of bands could possibly extend out to more than 10 which would require a rather expensive implementation to automatically select one of the many band select switches. Some prior art band select resistors and switches have been replaced with a continuous potentiometer which requires manual adjustment and operator skill for maintaining the proper reference voltage and display height.

Figure 2:
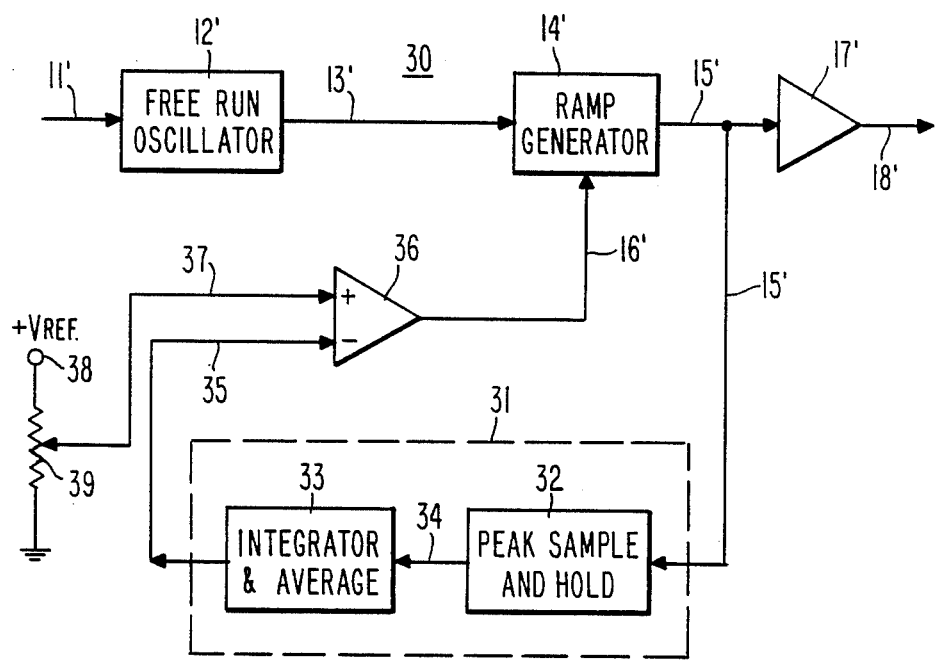
FIG. 2 is a simplified block diagram of the present invention dynamic vertical height control circuit.

Refer now to FIG. 2 which is a simplified block diagram of the present invention dynamic vertical height control circuit 30 which maintains an accurate constant vertical height at the output of the ramp generator. The height control circuit 30 for purposes of this discussion will have the same input signal as FIG. 1 on line 11' which is now applied to an identical free running oscillator 12' to produce the identical ramp reset control signal on line 13' that is applied to the ramp generator 14'. The novel control signal on line 16' is generated by a novel feedback loop circuit shown in FIG. 2 to comprise means 31 for determining the magnitude of the average ramp output signal on line 15'. Low noise feedback means 31 in the preferred embodiment comprises a peak sample and hold circuit 32 which is coupled to an integrator and averaging circuit 33 by line 34 to produce an analog voltage output on line 35 which is indicative of the average amplitude of the ramp signal produced on line 15' at the output of the ramp generator 14'. This analog signal on line 35 is applied to the negative input of comparator 36 which has its positive input at line 37 connected to a positive reference voltage 38 through a height control potentiometer 39.

The magnitude determining means 31 preferably embodies means for averaging a series of peaks rather than responding instantaneously to individual peaks so that the feedback control circuit is extremely stable. While the preferred embodiment is shown implemented with a sample and hold circuit, the same analog voltage or error signal at the output of comparator 36 on line 16' can be produced by employing a frequency to voltage converter which is a more expensive structure than the preferred embodiment shown. The output of the ramp generator 14' on line 15' is applied to a amplifier 17' to produce a highly stable constant amplitude deflection ramp signal on line 18' which is employed to drive the yoke circuits of the CRT in the display.

Figure 3:
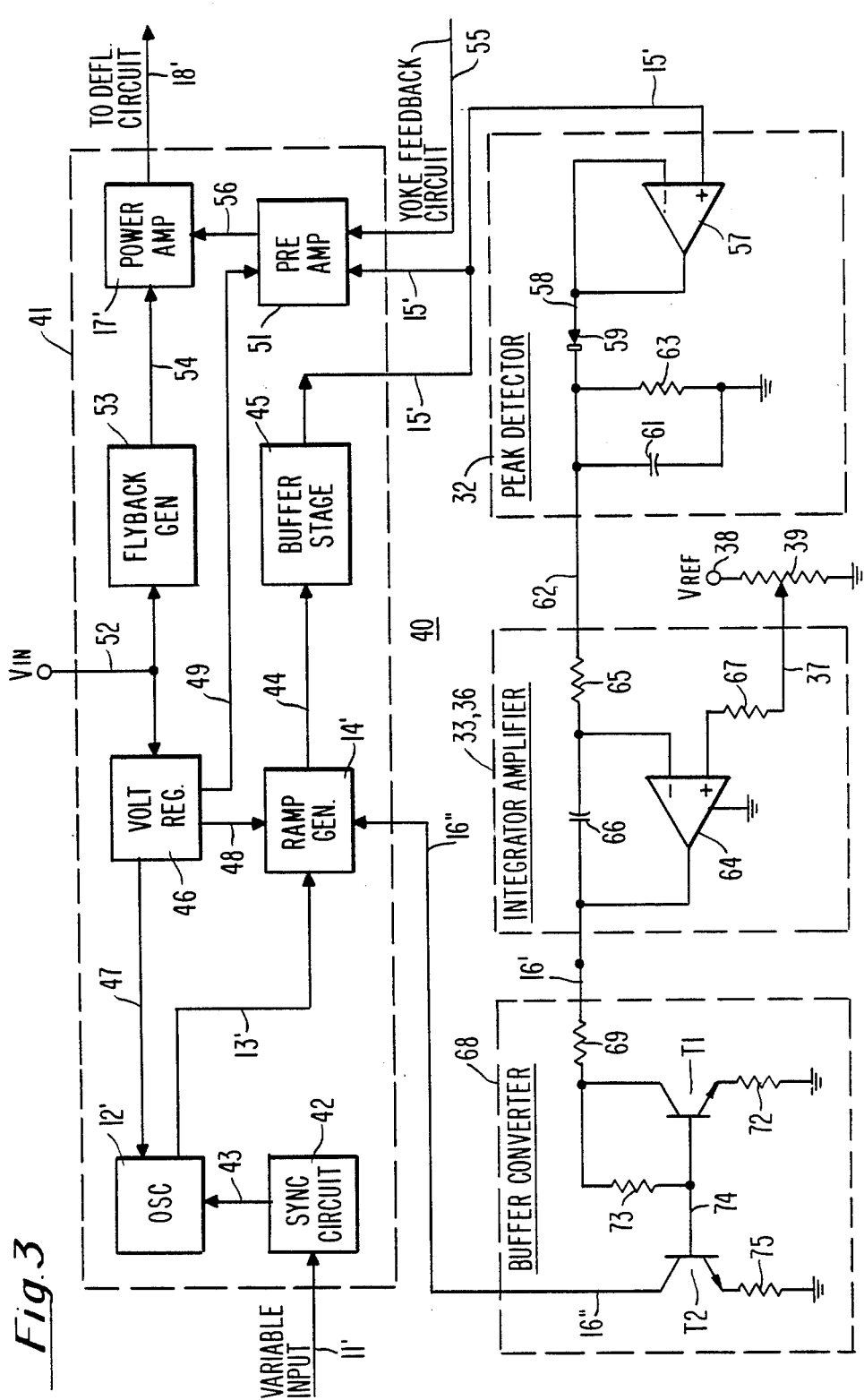
FIG. 3 is a more detailed block diagram of the present invention dynamic vertical height control circuit.

Refer now to FIG. 3 which is a more detailed block diagram of the present invention dynamic vertical height control circuit 40. In the preferred embodiment circuit shown in FIG. 3, the input line 11' is shown being applied to a vertical deflection integrated circuit chip 41, which is a commercially available chip, employed in numerous CRT displays but does not have the capability of maintaining constant height signals on output line 18' when receiving variable input frequencies on line 11'. The circuitry shown outside of chip 41 is a preferred embodiment modification which may be incorporated on one chip with the circuitry shown inside of phantom lines 41 to provide a highly stable noise free dynamic vertical height control circuit. The input signal on line 11' is applied to a sync processing circuit 42 to produce an output signal on line 43 which is applied to a free running oscillator 12' of the type previously described. The output from the oscillator 12' on line 13' is applied to the ramp generator 14' to produce an output signal on line 44 which is applied to a buffer stage 45 to produce the aforementioned ramp output signal on line 15'. The signal on line 15' is applied to the feedback loop shown in FIG. 2 to include the means 31 for determining the magnitude of the ramp signal. The integrated circuit (IC) 41 further includes a voltage regulator 46 which supplies output voltage signals on line 47, 48 and 49 to the oscillator 12 ramp generator 14 and preamplifier 51 respectively. A voltage input signal on line 52 is applied to the voltage regulator 46 and the flyback generator 53. Flyback generator 53 produces a supply voltage on line 54 coupled to the power amplifier 17 which generates an increased DC voltage for flyback.

A yoke current feedback signal on line 55 from the yoke circuits is applied to the preamplifier 51 to produce a compensated ramp voltage signal on line 56 which is applied to the power amplifier 17'. The voltage signal on line 55, which is indicative of the yoke current, is employed as a negative feedback signal in the feedback loop of power amplifier 17'.

The ramp output signal on line 15' is applied to the peak sample and hold circuit 32 which comprises a buffer amplifier 57 that produces a buffered ramp output signal on line 58 which is fed back to the negative input of amplifier 57. The signal on line 58 is peaked by sample diode 59 and applied to hold capacitor 61 via line 62. Resistor 63 in parallel with capacitor 61 determines the hold time of the capacitor 61. The signal on line 62 is also applied to the integrator amplifier circuit 33, 36 which comprises a comparator integrator 64, input resistor 65 and integrating capacitor 66 to produce the aforementioned amplitude control signal on line 16' which could be applied directly to the ramp generator 14'. The positive side of comparator integrator 64 is connected to the reference voltage potentiometer 39 via line 37 and resistor 67 as was explained hereinbefore.

The reason for not applying the amplitude control signal on line 16' directly to ramp generator 14' is that the particular ramp generator 14' requires a current input instead of a voltage input. Accordingly, buffer converter 68 is provided to convert the voltage signal on line 16' to a current signal on line 16' which is the control signal being applied to ramp generator 14'. Buffer converter 68 comprises an input resistor 69 connected to the collector of transistor T1 whose emitter is connected through a resistor 72 to ground. Resistor 73 is connected to the base of transistors T1 and T2 at line 74 to provide the bias signal for controlling transistors T1 and T2. Transistor T2 has its emitter connected to ground through resistor 75 and has its collector connected to line 16' to provide a current control signal at ramp generator 14'. Thus, buffer converter 68 converts the voltage signal to a current signal and will not be required for ramp generators 14 which are controlled by voltage signals.

Integrator amplifier 33, 36 serves the dual function of integrating, amplifying and comparing as explained with regards to elements 33 and 36 in FIG. 2. The peak sample and hold detector of the type shown in element 32 may be replaced with a frequency to voltage converter or alternatively the frequency to voltage converter (not shown) may embody the functions of elements 32 and 33 and/or 32, 33 and 36. It will be understood that the purpose of the circuits 32, 33 and 36 is to form a feedback loop which serves as a means 31 for determining the magnitude of the output ramp signal from the ramp generator 14' and automatically controlling the voltage control input signal to the ramp generator 14'.

Having explained a preferred embodiment and at least one modification of the dynamic vertical height control circuit, it will be understood that other modifications may be made to enhance the circuit without detracting from the main feature of the invention which permit the setting of a display height on the CRT which is then maintained over a broad range of variable input frequencies. Even if the prior art switches of the type described in FIG. 1 are substituted for the continuously variable reference voltage on line 37, the invention would still offer an improvement in cost and mode of operation over the prior art which permitted ramp output signal height variations within the selected bands.

What is claimed is:

1. A dynamic vertical height control circuit comprising:
    variable frequency oscillator means for receiving a dynamic variable frequency input,
    ramp generator means coupled to the output of said oscillator means for generating a constant amplitude deflection ramp signal,
    feedback means coupled to the output of said ramp generator means for generating a constant level gain control signal which is applied to the gain control of the ramp generator for maintaining a constant amplitude ramp signal from said ramp generator over a range of frequencies, said feedback means comprising a comparator in a feedback loop having a voltage reference input and an analog voltage input indicative of the average analog voltage generated from the output of said ramp generator.

2. A dynamic vertical height control circuit as set forth in claim 1 wherein said feedback means comprises a peak sample and hold circuit connected to the buffered output of said ramp generator coupled in the feeback loop.

3. A dynamic vertical height control circuit as set forth in claim 2 wherein said feedback means further comprises an integrator amplifier coupled in the feedback loop.

4. A dynamic vertical height control circuit as set forth in claim 3 wherein said integrator amplifier includes said comparator.

5. A dynamic vertical height control circuit as set forth in claim 1 wherein said feedback means comprises a frequency to voltage converter means in the feedback loop.

6. A dynamic vertical height control circuit as set forth in claim 5 wherein said frequency to voltage converter further comprises said comparator means.

7. A dynamic vertical height control circuit as set forth in claim 1 which further includes a buffer converter coupled to the output of said feedback control means for converting a voltage feedback signal to a current feedback signal.

8. A dynamic vertical height control circuit as set forth in claim 7 wherein said buffer converter comprises a pair of transistors connected as a current mirror.

9. A dynamic height control circuit as set forth in claim 1 wherein said feedback means comprises a low noise feedback loop.

* * * * *